United States Patent [19]
Levy

[11] Patent Number: 5,183,775
[45] Date of Patent: Feb. 2, 1993

[54] METHOD FOR FORMING CAPACITOR IN TRENCH OF SEMICONDUCTOR WAFER BY IMPLANTATION OF TRENCH SURFACES WITH OXYGEN

[75] Inventor: Karl B. Levy, Los Altos, Calif.

[73] Assignee: Applied Materials, Inc., Santa Clara, Calif.

[21] Appl. No.: 468,521

[22] Filed: Jan. 23, 1990

[51] Int. Cl.$^5$ .......................................... H01L 21/70
[52] U.S. Cl. ........................................... 437/60; 437/24; 437/38; 437/919; 148/DIG. 14; 148/DIG. 106; 148/DIG. 118
[58] Field of Search ...................... 437/60, 24, 18, 38, 437/52, 919; 148/DIG. 14

[56] References Cited

U.S. PATENT DOCUMENTS

| | | | |
|---|---|---|---|
| 4,376,672 | 3/1983 | Wang et al. | 148/DIG. 131 |
| 4,401,054 | 8/1983 | Matsuo et al. | 118/723 |
| 4,578,589 | 3/1986 | Aitken | 250/492.2 |
| 4,784,720 | 11/1988 | Douglas | 437/228 |
| 4,794,434 | 12/1988 | Pelley, III | 357/43 |
| 4,903,189 | 2/1990 | Ngo et al. | 357/23.4 |
| 4,931,409 | 6/1990 | Nakajima et al. | 437/67 |
| 4,941,026 | 7/1990 | Temple | 357/23.4 |

FOREIGN PATENT DOCUMENTS

| | | | |
|---|---|---|---|
| 62-71156 | 4/1987 | Japan . | |
| 0202033 | 8/1988 | Japan | 437/24 |

OTHER PUBLICATIONS

Silicon Processing for the VLSI Era, vol. II; Wolf 1986; pp. 51-56 and pp. 600-602.
Inspec. Abstract A89105190; B89065468; Shimada et al.
Inspec. Abstract B88013146; Hartney et al.
Inspec. Abstract A90058879; B90032413; Torii et al.
Inspec. Abstract; Torii et al.; Title: Very high current ECR ion source for an oxygen ion implanter.
A high current density and long lifetime ECR source for oxygen implanters; Torii et al.; Present. Jul. 10, 1989; pp. 253-255; vol. 61; No. 1.
Oxygen reactive ion etching for multilevel lithography; Hartney et al.; SPIE vol. 771; 1987; pp. 353-357.
Kao, Dah-Bin et al, "Two-Dimensional Thermal Oxidation of Silicon-I. Experiments", *IEEE Transactions on Electron Devices*, vol. Ed-34, No. 5, May, 1987, pp. 1008-1017.
Kao, Dah-Bin et al, "Two-Dimensional Thermal Oxidation of Silicon-II. Modeling Stress Effects in Wet Oxides", *IEEE Transactions on Electron Devices*, vol. Ed-35, No. 1, Jan., 1988, pp. 25-37.
Sinclair, R. et al, "A High Resolution Electron Microscopy Study of the Fine Structure in a Trench Capacitor", *Journal of Electrochemical Society*, vol. 136, No. 2, Feb., 1989, pp. 511-518.

*Primary Examiner*—Brian E. Hearn
*Assistant Examiner*—Michael Trinh
*Attorney, Agent, or Firm*—John P. Taylor

[57] ABSTRACT

An improved process for formation of a capacitor in a trench formed in a semiconductor wafer is disclosed. The improved process comprises selectively implanting oxygen through the bottom surface of the trench into the region of the wafer adjacent the bottom surface of the trench and through the surfaces at the top corners of the trench into regions of the wafer adjacent such surfaces at the top corners of the trench using a plasma formed in a plasma-assisted etching apparatus while maintaining a high negative DC bias on the wafer being implanted. Subsequent growth of oxide on the surfaces of the trench will cause the implanted oxygen to form additional oxide in the implanted regions of the wafer adjacent the bottom surface of the trench and adjacent the surface at the top corners of the trench to compensate for the lower oxide growth rates in these areas.

12 Claims, 3 Drawing Sheets

METHOD FOR FORMING CAPACITOR IN TRENCH OF SEMICONDUCTOR WAFER BY IMPLANTATION OF TRENCH SURFACES WITH OXYGEN

BACKGROUND OF THE INVENTION

1. Field of the Invention

This invention relates to the processing of semiconductor wafers. More particularly, this invention relates to an improvement in a method for forming a capacitor in a trench in a semiconductor wafer by implanting the trench with oxygen resulting in subsequent formation of a layer of oxide of more uniform thickness.

2. Description of the Related Art

In the formation of integrated circuit structures in semiconductor wafers, trenches or slots are often formed in the wafer, e.g., a silicon substrate, to form oxide portions therein to provide isolation between adjacent active devices. While the entire trench could be filled with oxide, to avoid the formation of voids in the trench, the walls of the trench, including the bottom, are usually oxidized and the remainder of the trench is then filled with another material, such as polysilicon.

When a polysilicon filler, or some or conductive material, is used to fill the trench, it is possible to form a capacitor from the trench materials, using the conductive filler such as polysilicon as one electrode, the silicon substrate as the other electrode, and the oxide on the walls of the trench as the dielectric. The dimensions of the trench, i.e., the area covered by oxide and the thickness of the oxide, control the amount of capacitance.

One problem which has been encountered, however, in the formation of such capacitors, is that the oxide layer formed in the trench is not uniform in thickness. It has been found that oxide forms on silicon at the fastest rate on the vertical sidewalls of the trench, i.e., the relatively flat walls, while oxide forms at the slowest rate on the concave bottom wall of the trench. Oxide is formed at an intermediate rate on the silicon surface at the convex curves at the top of the trench.

For example, when silicon oxide ($SiO_2$) is grown at about 1000° C., in a trench formed in a silicon semiconductor wafer, to a thickness of about 200 Angstroms on the sidewalls of the trench, the curved bottom surface of the trench, having a radius of curvature of about 0.5 microns, may have an oxide thickness of only about 100 Angstroms, and the trench surfaces at the convex corners at the top of the trench may have an oxide thickness of about 180 Angstroms.

The phenomenon of formation of oxide at nonuniform rates on the surfaces of trenches formed in silicon substrates is known and has been discussed in the literature. For example, Sinclair et al, in an article entitled "A High Resolution Electron Microscopy Study of the Fine Structure in a Trench Capacitor", published in Journal of the ElectroChemical Society, Vol. 136, No. 2, in February 1989 at pages 511–518, point out, on page 511, that thickness variations in the oxide layer occur at curved surfaces of trenches, e.g., at the top and bottom corners, and that the crystallographic dependence of silicon oxidation rate can introduce oxides of different thickness on the various crystallographic faces.

As a result of this, when a capacitor is formed using such an oxide layer as the dielectric, voltage breakdown of the capacitor most likely will occur in the region at the bottom of the trench where the formed oxide layer is the thinnest.

This presents a dilemma since the sidewalls of the trench represent the largest area and, therefore, the thickness of the oxide over this region will control the amount of capacitance which can be formed. If the overall oxide coating is made thick enough to withstand voltage breakdown in the thinnest region, i.e., the bottom of the trench, the oxide coating may be too thick on the sidewalls for the desired capacitor formation.

As trenches with higher aspect ratios become more common, i.e., narrower and deeper trenches with aspect ratios greater than 10:1, this problem is exacerbated. This is because the narrower the trench, the sharper the curvature at the bottom of the trench becomes, resulting in even poorer oxide growth on the surfaces at the bottom of the trench.

Therefore, it would be desirable to be able to form an oxide coating of more uniform thickness on the surfaces of a trench of a semiconductor wafer, particularly a trench with a high aspect ratio, to avoid the problem of voltage breakdown in thin regions of the dielectric oxide layer without making the dielectric oxide too thick for useful capacitor formation.

SUMMARY OF THE INVENTION

It is, therefore, an object of this invention to provide an improved process for formation of a capacitor in a trench of a silicon semiconductor wafer which improvement comprises selectively implanting oxygen into regions of the silicon wafer adjacent the surfaces of the trench where oxide normally forms at slower rates.

It is another object of this invention to provide an improved process for formation of a capacitor in a trench of a semiconductor wafer which improvement comprises selectively implanting oxygen into regions of the silicon wafer adjacent the bottom surface of the trench and adjacent the surface at the top corners of the trench where oxide normally forms at slower rates.

It is still another object of this invention to provide an improved process for formation of a capacitor in a trench of a semiconductor wafer which improvement comprises selectively implanting oxygen into the silicon wafer through the bottom surface of the trench and through the surface at the top corners of the trench using a plasma formed in a plasma-assisted etching apparatus.

It is a further object of this invention to provide an improved process for formation of a capacitor in a trench of a semiconductor wafer which improvement comprises selectively implanting oxygen into the silicon wafer through the bottom surface of the trench and through the surface at the top corners of the trench using a plasma formed in a plasma-assisted etching apparatus while maintaining a high DC bias on the wafer being implanted.

These and other objects of the invention will be apparent from the following description and accompanying drawings.

DETAILED DESCRIPTION OF THE INVENTION

Figure 1:
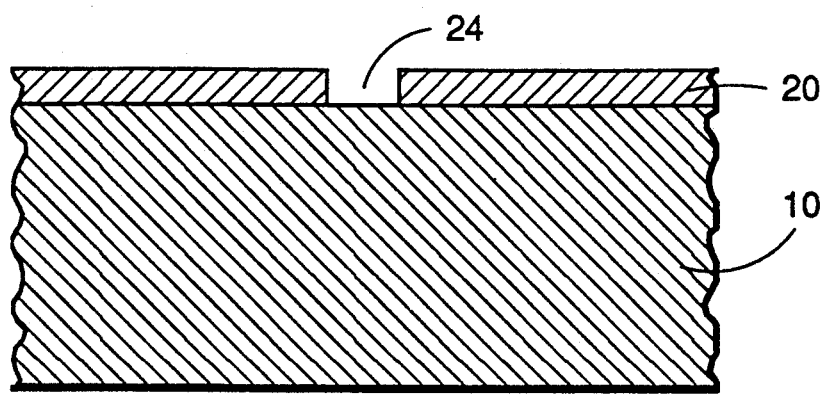
FIGS. 1–7 are fragmentary vertical cross-section views sequentially showing the step by step formation of a capacitor in a trench in accordance with the invention.

Referring now to the drawings, FIG. 1 shows a semiconductor wafer or substrate 10, such as a silicon wafer, on which has been formed a silicon dioxide ($SiO_2$) layer 20. Oxide layer 20 has been patterned to form an opening 24 through which a trench may be etched in silicon substrate 10.

Figure 2:
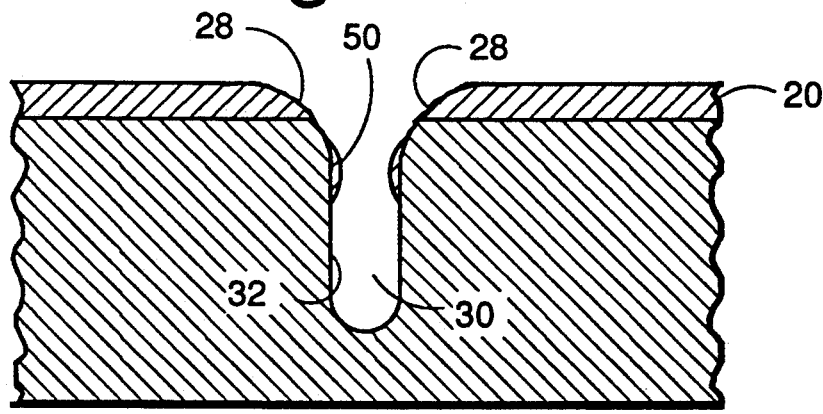

FIG. 2 shows a trench 30 which has been formed in substrate 10 through opening 24 in mask layer 20 using a conventional anisotropic etch such as a reactive ion etch (RIE), using a halogen chemistry, with reactants such as, for example, $SiF_4$, $SF_6$, $NF_3$, $CF_4$, $C_2F_6$, HBr, $Cl_2$, HCl, $CCl_4$, etc. It will be noted that etch residues 50, which will be removed later, are formed on the sidewalls 32 of trench 30 during the etch step.

Figure 3:
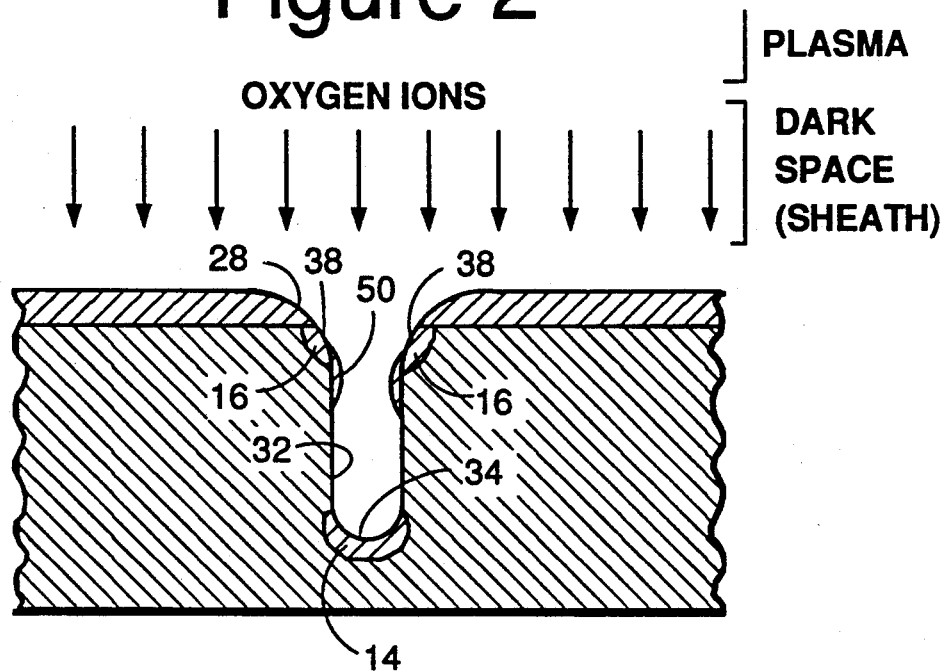

After formation of trench 30, in accordance with the invention, oxygen ions are selectively implanted, as shown in FIG. 3, through the surface of bottom wall 34 into the silicon substrate region 14 adjacent the bottom wall 34 of trench 30, as well as, to a lesser extent, through the surface at the upper corners 38 of trench 30 into regions 16 of substrate 10 adjacent the upper corners 38 of trench 30.

By the use of expressions such as ". . . regions of the silicon substrate adjacent the bottom surface . . . " and ". . . regions of the silicon substrate adjacent the surface at the top corners . . . " is meant those portions or regions of the silicon wafer which include both the surface and the region or portion immediately below the surface, e.g., the region or portion of the substrate within about 1000 Angstroms of that particular surface.

It should be noted, with respect to the implantation of oxygen into regions 16 adjacent the upper corners 38 of trench 30, that such oxygen implantation is made possible, despite the presence of oxide mask layer 20, because portions of oxide mask layer 20 at the corners of the trench are removed or thinned, during the etching step, as shown at 28 in FIG. 2, by being physically sputtered away.

The oxygen ions are anisotropically implanted into wafer 10 using an ion beam or stream which is generally perpendicular to the plane of the surface of wafer 10 resulting in the selective implantation in regions 14 and 16, rather than into the regions of wafer 10 adjacent sidewalls 32 of trench 30.

Implantation of the oxygen ions into wafer 10 may be carried out using any conventional ion implantation apparatus such as is well known to those skilled in the art. An example of such a conventional ion implantation apparatus is described in Aiken U.S. Pat. No. 4,578,589, assigned to the assignee of this invention.

The implantation can also be carried out using a plasma etching apparatus containing a magnetic circuit for forming a magnetic flux density to provide electron cyclotron resonance (ECR) using an rf bias of greater than 10 kHz to bias the wafer negatively in the standard manner. An example of such a plasma apparatus which provides ECR is described in U.S. Pat. No. 4,401,054.

However, since formation of trench 30 is conventionally carried out using dry etching process apparatus, such as an RIE etching apparatus, it would be convenient to carry out the implantation in the same apparatus used to form the trench.

In accordance with a preferred embodiment of the invention, this may be carried out by introducing an oxygen-bearing gas into the RIE apparatus and then igniting a plasma therein to cause implantation of oxygen atoms into the silicon semiconductor wafer.

Figure 8:
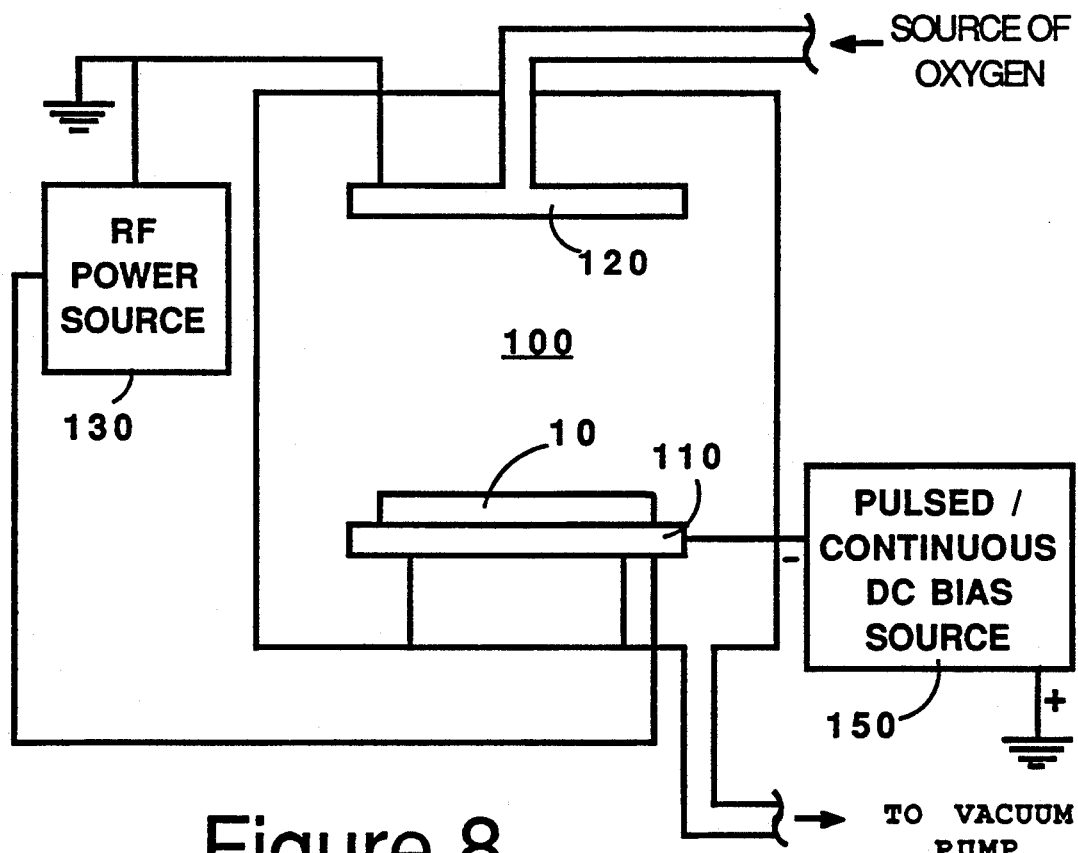
FIG. 8 is a diagrammatic view of the apparatus used in the formation of the capacitor in the trench of the semiconductor wafer.

The plasma is struck between wafer 10, which, as shown in FIG. 8, rests on a cathode 110 in a plasma etching chamber 100, and an anode 120 which is positioned in chamber 100 at a spaced distance from cathode 110 and wafer 10 resting thereon. An external source of rf power 130 is connected to cathode 110 and anode 120 and energized to form the plasma. The power level used in forming the plasma may vary within a range of from about 25 to about 2000 Watts, preferably within a range of from about 500 to about 1000 Watts. Ions from the plasma, affected by the DC charge difference between the positively charged plasma and the negatively charged cathode or grounded anode will then flow in a direction perpendicular to the surface of wafer 10, i.e. in the direction or axis of trench 30, as shown by the arrows in FIG. 3.

A gaseous source of oxygen, such as $O_2$, $O_3$, $CO_2$, CO, $NO_2$, or any other oxygen-bearing gas which, upon ionizing, will not interfere with the implantation process, may be used as the source of oxygen in the process. The amount of oxygen-bearing gas needed to provide a source for the formation of oxygen ions is very small and the total amount which is supplied to chamber 100 will, therefore, be largely governed by the vacuum to be maintained in the apparatus during the implantation. Usually this vacuum will vary within a range of from about $10^{-1}$ Torr to about $10^{-5}$ Torr during the implantation step and the flow of the oxygen-bearing gas into the chamber will be within a range of from about 1 to about 100 sccm.

The temperature in the apparatus, during the oxygen implantation step, will usually be maintained within a range of from about 0° C. to about 100° C.

The gaseous source of oxygen supplies the oxygen atoms needed to form the oxygen ions in the plasma. The plasma supplies the energy needed to form the oxygen ions and also sets up a negative bias on wafer 10 which directs the oxygen ions in the plasma toward the wafer 10. The typical DC bias voltage across the plasma sheath (the time-average voltage difference between wafer 10 and the plasma) is within a range of from about 100 Volts to about 3000 Volts DC.

Alternatively, or in supplement to the constant bias, a second pulsating/continuous DC power supply 150 can be used, if desired, to apply spikes or pulses of high voltage bias, e.g., up to about 50 kV, on wafer 10 by grounding the positive terminal and connecting the negative bias to wafer 10 via cathode 110.

The total voltage drop or bias on wafer 30, with respect to grounded anode 120, will be controlled by the power used in the plasma, the pressure in the chamber, and by any magnetic field present during the implantation.

The presence or absence of a magnetic field in the chamber during the implantation is optional. In some RIE apparatus, magnetic coils or permanent magnets are used to provide magnetic field enhanced reactive ion etching wherein coils or bars are disposed on the sides or bottom of the reaction chamber to provide magnetic fields with a movable or rotatable magnetic moment lying in the plane of the wafer which is moved or rotated in a plane parallel to the wafer by changing the current flow in the respective coils or by physically moving or oscillating the permanent magnets to thereby enhance the ion flow toward the wafer.

In any event, the total voltage drop between wafer 10 and the plasma, as controlled by the parameters discussed above, will determine the depth of the implant, while the time of the implant will determine the concentration. In accordance with the invention, the depth of the center of the distribution of depths of the implanted oxygen in wafer 10, which will extend inwardly from the surface, will vary from a minimum of about 20 Angstroms to a maximum of about 800 Angstroms while the concentration of the implanted oxygen atoms will vary from about $10^{21}$ atoms/cc to about $10^{23}$ atoms/cc.

Figure 4:
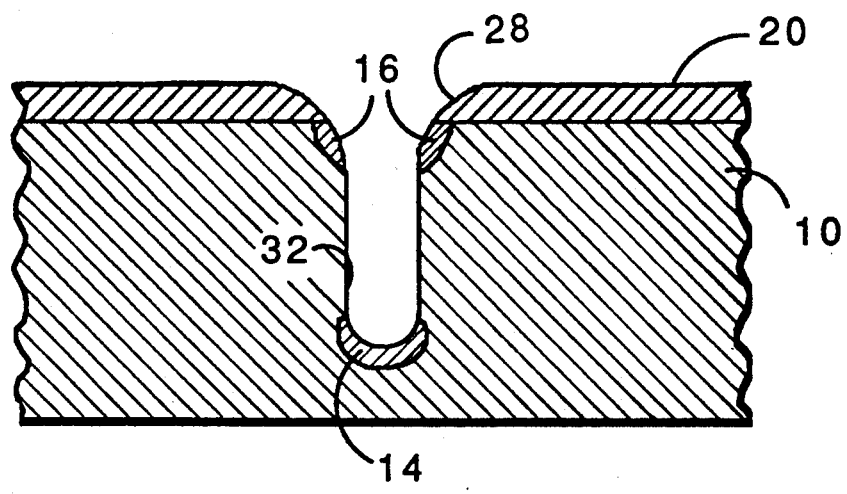

After the step of implanting oxygen into regions 14 and 16 of wafer 10, etch residues 50 may be removed, as shown in FIG. 4, either by a dry etch or using a wet etch such as HF in preparation for the conventional oxidation of the surfaces of trench 30. For example, if a wet etch is used, immersion in dilute HF, in a ratio of 100 parts by volume $H_2O$ to 1 part by volume HF, for a short time, e.g., 15 seconds, is sufficient to remove any residue.

After implantation of the oxygen into regions 14 and 16 of wafer 10, and removal of etch residues 50, the walls of trench 30 are conventionally oxidized using, for example, $O_2$ or steam at a temperature within a range of from about 900° C. to about 1100° C. for a period of time within a range of from about 20 minutes to about 60 minutes. Under these conditions, sufficient activation energy, in the form of thermal energy, will be supplied to the implanted wafer substrate to break the Si-Si bonds permitting the silicon to form Si-0 bonds with the implanted oxygen, as well as the diffused oxygen from the ambient, in regions 14 and 16.

Figure 5:
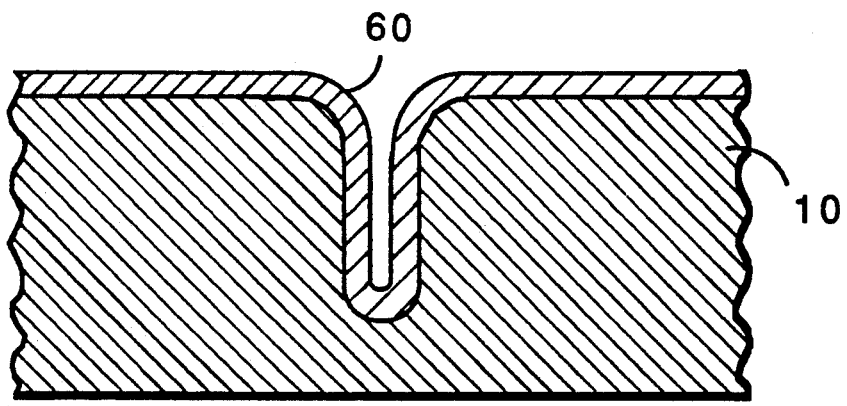

As a result, as silicon oxide preferentially grows on sidewall 32 of trench 30, supplemental silicon oxide is being formed in regions 14 and 16 which counters the slower rate of oxide growth on the sharp curves of bottom wall 34 of trench 30 adjacent region 14 and the curves at corners 38 of trench 30 adjacent regions 16 of substrate 10. The result is an oxide coating over the entire surface of trench 30, as shown in FIG. 5, which is sufficient to permit formation of a capacitor without risk of breakdown of the dielectric at the curved portions 34 and 38 of trench 30 due to inadequate formation of oxide in those areas.

It should be noted in this regard, that it is not essential, in the practice of the invention, that the thickness of oxide layer 60 formed at curved portions 34 and 38, conjointly by the conventional oxidation process and by the supplemental oxide formed in implanted regions 14 and 18, exactly match in thickness the thickness of oxide layer 60 grown on sidewalls 32 of trench 30.

This is because the area of the capacitor represented by the oxide grown on sidewalls 32 far exceeds the area on which oxide will be grown at curved portions 34 and 38. Thus, the size of the capacitor is, for the most part, only controlled by the size (area) of the sidewalls 32 and the thickness of the oxide grown over this area, with the thickness of the oxide formed over curved surface portions 34 and 38 of trench 30 only playing a role in the prior discussed problem of voltage breakdown of the capacitor.

It is, therefore, only important that the thickness of oxide layer 60 formed on curved surface portions 34 and 38 be sufficiently thick to prevent breakdown of the capacitor at such regions at the voltages at which the capacitor will be operated.

In a preferred embodiment, to ensure that voltage breakdown will not occur across the oxide on such curved surfaces as over regions 14 and 16, one should provide an oxide thickness over such regions at least as thick as the oxide grown on sidewalls 32, i.e., the trench surfaces without implantation. One may provide an oxide coating thickness at curved surface portions 34 and 38 which will always exceed the oxide thickness on sidewalls 32 by implanting a sufficiently high concentration of oxygen into regions 14 and 16 (within the depth range previously discussed) relative to the thickness of the oxide layer to be grown on the sidewalls. In that manner, one may be sure that voltage breakdown is not occurring in the capacitor due to inadequate formation of oxide over such curved portions, while at the same time, not materially interfering with the capacitance value due to overly thick oxide formed over such curved portions.

Thus, when it is desired to form a certain oxide coating thickness on sidewalls 32 of trench 30 to provide a particular value of capacitance (which will, of course vary with the dimensions of the trench for that particular dielectric thickness), the implantation of oxygen atoms into regions 14 and 16 should preferably be at a sufficient concentration (and within the specified depth range) so that subsequent oxidation of the sidewalls to that particular desired oxide thickness will result in the formation of oxide at curved portions 34 and 38 of trench 30 which will exceed that thickness of oxide coating on sidewalls 32. If a thicker oxide layer is desired on the unimplanted sidewalls, then the concentration of implanted oxygen atoms into regions 14 and 16 will be commensurately increased to again ensure that the oxide thickness adjacent regions 14 and 16 exceeds the oxide thickness over the unimplanted regions.

Figure 6:
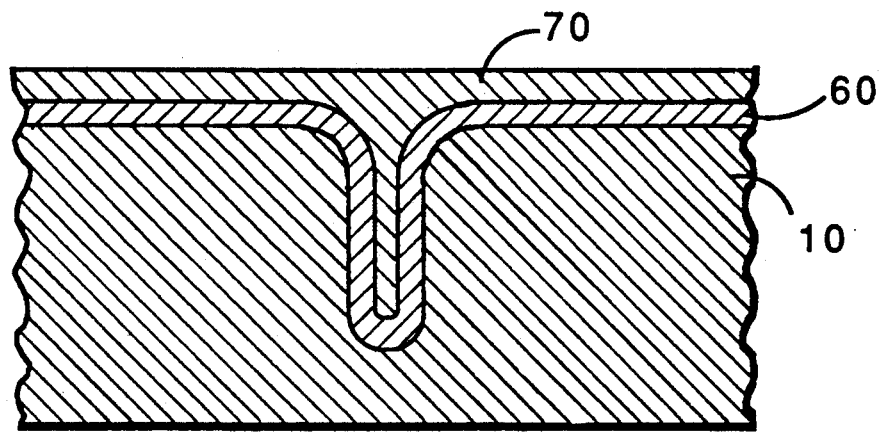
Figure 7:
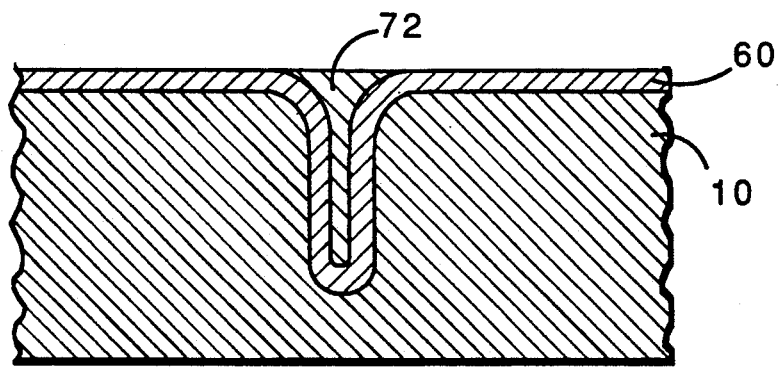

After formation of oxide layer 60 on the surfaces of trench 30, a polysilicon layer 70 may be blanket deposited over the entire structure which then fills trench 30, as shown in FIG. 6. The structure may then be RIE etched (or using any other etch) to remove the polysilicon on oxide mask layer 20 on the surface of wafer 10, leaving only polysilicon portion 72 in trench 30 which will then form the other electrode for the capacitor, as shown in FIG. 7. An electrical contact may then be formed to polysilicon portion 72, for example, using aluminum or polysilicon wiring or in any other conventional manner.

Thus, the invention provides an improved method of forming a capacitor in a trench formed in a semiconductor wafer wherein oxygen, implanted into the wafer adjacent the curved bottom surface of the trench and adjacent the curved upper corners of the trench, forms additional or supplemental oxide during the growth of oxide on the surfaces of the trench at an elevated temperature to improve the breakdown characteristics of the capacitor. In a preferred embodiment, a sufficient concentration of oxygen atoms will be implanted to provide oxide thicknesses over such curved surfaces which exceeds the thickness of the oxide over unimplanted regions. By ensuring that the oxide on these curved surfaces will not be thinner than the oxide grown on the vertical sidewalls of the trench, breakdown of the capacitor will not occur as a result of thin oxide formation over such curved surfaces.

Having thus described the invention, what is claimed is:

1. A process for forming a capacitor in a trench in a surface of a silicon wafer wherein said silicon wafer comprises one electrode of said capacitor which consists essentially of:
  (a) forming a mask layer having an opening therein on said surface of said silicon wafer;
  (b) placing said masked silicon wafer in an RIE etch apparatus;
  (c) anisotropically RIE etching a trench in said silicon wafer through said mask opening on said wafer in said RIE apparatus;
  (d) selectively anisotropically implanting oxygen atoms into a region of said wafer adjacent a curved bottom surface of said trench and into regions of said wafer adjacent top corner surfaces of said trench in said same RIE etch apparatus;
  (e) then removing, from side surface of said trench, etch residues remaining from said etching step;
  (f) thereafter growing an oxide layer on the surfaces of said trench which will serve as the dielectric of said capacitor by the steps of:
    (i) heating said silicon wafer to a temperature with a range of from about 900° C. to about 1100° C.;
    (ii) exposing said silicon wafer to a gaseous source of oxygen while maintaining said silicon wafer within said temperature range; and
    (iii) continuing to expose said silicon wafer to said gaseous source of oxygen at said temperature for a period of from about 20 minutes to about 60 minutes;
  whereby sufficient activation energy, in the form of thermal energy, will be supplied to the implanted wafer to permit the silicon in said silicon wafer to form Si-O bonds within said implanted oxygen atoms in said selected oxygen-implanted regions of said wafer; and
  (g) filling said trench with a conductive material capable of forming the other electrode of said capacitor.

2. The process of claim 1 wherein said step of selectively implanting oxygen atoms into said regions of said wafer adjacent said curved bottom surface of said trench and adjacent said top corner surfaces of said trench further comprises flowing a gaseous source of oxygen into said apparatus at a flow rate within the range of from about 1 sccm to about 100 sccm.

3. The process of claim 2 wherein said gaseous source of oxygen is selected from the class consisting of $O_2$, $O_3$, $CO_2$, CO, and $NO_2$.

4. The process of claim 2 wherein said step of selectively implanting oxygen atoms into said regions of said wafer adjacent said curved bottom surface of said trench and adjacent said top corner surfaces of said trench further comprises igniting a plasma at a power level within a range of from about 25 to about 2000 watts between said wafer and an electrode in said apparatus spaced from said wafer while said gaseous source of oxygen in flowing through said apparatus.

5. The process of claim 4 wherein said step of selectively implanting oxygen atoms into said regions of said wafer adjacent said curved bottom surface of said trench and adjacent said top corner surfaces of said trench further comprises negatively biasing said wafer with respect to said spaced apart electrode by electrically connecting said wafer to the negative terminal of a DC power supply having its grounded positive terminal electrically connected to said spaced apart electrode.

6. The process of claim 5 wherein said step of negatively biasing said wafer with respect to said spaced apart electrode further comprises negatively biasing said wafer within a range of from about −100 to about −3000 volts DC.

7. The process of claim 5 wherein said step of negatively biasing said wafer with respect to said spaced apart electrode further comprises negatively biasing said wafer to a source of pulsating DC of up to 50 kV.

8. The process of claim 4 wherein said step of selectively implanting oxygen atoms into said regions of said wafer adjacent said curved bottom surface of said trench and adjacent said top corner surfaces of said trench further comprises negatively biasing said wafer with respect to said spaced apart electrode by electrically connecting said wafer to the negative terminal of a DC power supply having its positive terminal electrically connected to ground and grounding the spaced apart electrode.

9. The process of claim 1 wherein said step of selectively implanting oxygen atoms into said regions of said wafer adjacent said curved bottom surface of said trench and adjacent said top corner surfaces of said trench further comprises implanting said oxygen atoms to a concentration within a range of from about $10^{21}$ atoms/cc to about $10^{23}$ atoms/cc.

10. The process of claim 1 wherein said apparatus is maintained at a vacuum within a range of from about 0.1 Torr to about $10^{-5}$ torr during said oxygen implant step.

11. A process for forming a capacitor in a trench in a surface of a silicon wafer wherein said silicon wafer comprises one electrode of said capacitor which consists essentially of:
  (a) forming a mask layer having an opening therein on said surface of said silicon wafer;
  (b) placing said masked silicon wafer in an RIE etch apparatus;
  (c) anisotropically RIE etching a trench in said silicon wafer through said mask opening on said wafer in said RIE apparatus;
  (d) selectively anisotropically implanting oxygen atoms through a curved bottom surface of said trench into the region of said wafer adjacent said curved bottom surface of said trench and through top corner surfaces of said trench into the regions of said wafer adjacent said top corner surfaces of said trench in said same RIE etch apparatus by:
    (i) flowing a gaseous source of oxygen into said apparatus at a flow rate within a range of from about 1 sccm to about 100 sccm;
    (ii) igniting a plasma at a power level within a range of from about 25 to about 2000 watts between said wafer and an electrode in said apparatus spaced from said wafer; and
    (iii) negatively biasing said wafer with respect to said spaced electrode within a range of from about −100 to −3000 volts DC by electrically connecting said wafer to the negative terminal of a DC power supplying having its positive terminal electrically connected to said spaced apart electrode;
  (e) then removing, from side surfaces of said trench, etch residues remaining from said etching step;
  (f) thereafter growing a thermal oxide layer on the surfaces of said trench which will serve as the dielectric of said capacitor by:
    (i) heating said silicon wafer to a temperature within a range of from about 900° C. to about 1100° C.;

(ii) exposing said silicon wafer to a gaseous source of oxygen while maintaining said silicon wafer within said temperature range; and (iii) continuing to expose said silicon wafer to said gaseous source of oxygen at said temperature for a period of from about 20 minutes to about 60 minutes;

whereby sufficient activation energy, in the form of thermal energy, will be supplied to the implanted wafer to permit the silicon in said silicon wafer to form Si-O bonds with said implanted oxygen atoms in said selected oxygen-implanted regions of said wafer; and (g) filling said trench with polysilicon to form the other electrode of said capacitor.

12. A process for forming a capacitor in a trench in a surface of a silicon wafer wherein said silicon wafer comprises one electrode of said capacitor which consists essentially of:

(a) forming an oxide mask layer having an opening therein on said surface of said silicon wafer;

(b) placing said masked silicon wafer in an RIE etch apparatus;

(c) RIE etching a trench anisotropically in said silicon wafer through said mask opening on said wafer in said RIE apparatus;

(d) selectively anisotropically implanting oxygen atoms, at a concentration range of from about $10^{21}$ atoms/cc to about $10^{23}$ atoms/cc, through a curved bottom surface of said trench into a region of said wafer adjacent said curved bottom surface of said trench and through top corner surfaces of said trench into regions of said wafer adjacent said top corner surfaces of said trench in said same RIE etch apparatus by:

(i) flowing a gaseous source of oxygen selected from the group consisting of $O_2$, $O_3$, $CO_2$, CO, and $NO_2$ into said apparatus at a flow rate within a range of from about 1 sccm to about 100 sccm;

(ii) igniting a plasma at a power level within a range of from about 25 to about 2000 watts between said wafer and an electrode in said apparatus spaced from said wafer; and (iii) negatively biasing said wafer with respect to said spaced electrode within a range of from about $-100$ to $-3000$ volts DC by electrically connecting said wafer to the negative terminal of a DC power supplying having its positive terminal electrically connected to said spaced apart electrode; and (iv) maintaining said apparatus under a vacuum within a range of from about 0.1 Torr to about $10^{-5}$ Torr;

(e) then removing, from side surfaces of said trench, etch residues remaining from said etching step;

(f) thereafter growing a thermal oxide layer on the surfaces of said trench which will serve as the dielectric of said capacitor by:

(i) heating said silicon wafer to a temperature within a range of from about 900° C. to about 1100° C.;

(ii) exposing said silicon wafer to a gaseous source of oxygen while maintaining said silicon wafer within said temperature range; and (iii) continuing to expose said silicon wafer to said gaseous source of oxygen at said temperature for a period of from about 20 minutes to about 60 minutes;

whereby sufficient activation energy, in the form of thermal energy, will be supplied to the implanted wafer to permit the silicon in said silicon wafer to form Si-O bonds with said implanted oxygen atoms in said selected oxygen-implanted regions of said wafer; and (g) filling said trench with polysilicon to form the other electrode of said capacitor.

* * * * *